United States Patent
Mei

(10) Patent No.: US 8,624,685 B2
(45) Date of Patent: *Jan. 7, 2014

(54) SYSTEM AND METHOD FOR REDUCING LOCK TIME IN A PHASE-LOCKED LOOP

(75) Inventor: Shizhong Mei, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 85 days.

This patent is subject to a terminal disclaimer.

(21) Appl. No.: 13/150,860

(22) Filed: Jun. 1, 2011

(65) Prior Publication Data

US 2011/0234324 A1 Sep. 29, 2011

Related U.S. Application Data

(63) Continuation of application No. 11/958,189, filed on Dec. 17, 2007, now Pat. No. 7,969,252.

(51) Int. Cl.
*H03B 5/20* (2006.01)

(52) U.S. Cl.
USPC ............................ 331/135; 327/158; 327/161

(58) Field of Classification Search
USPC .................................. 331/135; 327/158, 161
See application file for complete search history.

(56) References Cited

U.S. PATENT DOCUMENTS

| | | | |
|---|---|---|---|
| 5,446,867 A | 8/1995 | Young et al. | |
| 6,320,424 B1 | 11/2001 | Kurd et al. | |
| 6,359,950 B2 * | 3/2002 | Gossmann et al. | 375/376 |
| 6,617,932 B2 | 9/2003 | Kushner et al. | |
| 6,906,565 B2 | 6/2005 | Keaveney | |
| 6,943,600 B2 * | 9/2005 | Craninckx | 327/157 |
| 7,042,260 B2 | 5/2006 | Choi | |
| 7,504,893 B2 | 3/2009 | Gonzalez et al. | |
| 7,969,252 B2 * | 6/2011 | Mei | 331/135 |

* cited by examiner

*Primary Examiner* — Robert Pascal
*Assistant Examiner* — Jeffrey Shin
(74) *Attorney, Agent, or Firm* — Dorsey & Whitney LLP

(57) ABSTRACT

Increasing loop gain is a common practice for reducing lock time of phase locked loops. Very high loop gains, however, often result in increasing the lock time or causing loop instability. For very high loop gains, delaying the feedback clock signal along the feedback path of a phase locked loop decreases lock time and prevents instability. A delay circuit may be used at any location along the feedback path of the phase locked loop.

21 Claims, 8 Drawing Sheets

US 8,624,685 B2

SYSTEM AND METHOD FOR REDUCING LOCK TIME IN A PHASE-LOCKED LOOP

CROSS-REFERENCE TO RELATED APPLICATION

This application is a continuation of U.S. patent application Ser. No. 11/958,189, filed Dec. 17, 2007, U.S. Pat. No. 7,969,252. That application is incorporated by reference herein in its entirety and for all purposes.

TECHNICAL FIELD

This invention is directed toward phase locked loops, and more particularly one or more of the embodiments of this invention relates to reducing lock time in phase locked loops.

BACKGROUND OF THE INVENTION

A phase locked loop (PLL) is a closed loop frequency control system. The PLL adjusts the frequency of an internal signal until the phase of an internal signal is substantially the same as the phase of a reference signal (e.g., an external clock signal) to which the internal signal is "locked." When either the PLL is initially powered or the internal signal or reference signal is first applied to the PLL, the phase of the internal signal generally will be quite different from the phase of the reference signal. The PLL then adjusts the phase of the internal signal until it is aligned with the phase of the reference signal, and the PLL is thus locked with the reference signal.

There are many types of prior art PLLs available, one of which is a charge pump PLL 100 as shown in FIG. 1. The charge pump PLL 100 of FIG. 1 includes a phase detector 110, a charge pump 102, a filter 104, a voltage controlled oscillator 106, and an N frequency divider circuit 108 connected to each other as shown. The phase detector 110 compares the phases of two input signals, an external clock signal 112 and a feedback clock signal 114. The phase detector 100 then generates an UP_signal 120 or a DN_signal 122 depending on the phase difference between the two input signals 112 and 114. The UP_signal 120 and the DN_signal 122 are applied to a charge pump 102, which generates a voltage having a magnitude that changes in one direction in response to the UP_signal 120 and in the other direction in response to the DN_signal 122. The voltage from the charge pump 102 passes through the filter 104 to control the dynamic performance of the PLL 100. The filter 104 then outputs a control signal ("Vct") 124, or a phase error signal, that is applied to the voltage controlled oscillator 106 ("VCO"). The VCO 106 generates a periodic output clock signal having a frequency corresponding to (e.g., that is controlled by) the control signal Vct 124.

The output signal of the phase detector 110 causes the charge pump 102 and filter 104 to adjust the magnitude of the control signal Vct 124 to either increase or decrease the frequency of the output clock signal 116 generated by the voltage control oscillator 106. More specifically, the control signal Vct 124 has a magnitude that increases responsive to the UP_signal 120 and decreases responsive to the DN_signal 122. The control signal Vct 124 adjusts the frequency of the feedback clock signal 114 until the phase (which is the integral to the frequency) of the feedback clock signal 114 is equal to the phase of the external clock signal 112 so that the PLL 100 is locked. When the PLL is locked, the frequency of the feedback clock signal 114 will, of course, be equal to the frequency of the external clock signal 112. The feedback clock signal 114 may go through an N divider circuit 108 before being fed back into the phase detector 110 so that the frequency of the output clock signal 116 will be N times greater than the frequency of the external clock signal 112. The output clock signal 116 is then output from the PLL 100.

FIG. 2 is an example signal timing diagram illustrating the various signals that may be generated during a typical operation of the prior art PLL 100 in FIG. 1. At time $t_1$ the external clock signal 112 leads the feedback clock signal 114 by the difference of $t_0$ and $t_1$. In response to a rising edge of the external clock signal 112 at time $t_0$, the phase detector 110 drives the UP_signal 120 low. At time $t_1$ and in response to a rising edge of the feedback clock signal 114, the phase detector 110 drives the UP_signal 120 high. Therefore, the phase detector 110 generates the UP_signal 120 as a negative pulse having a width proportional to the time the feedback clock signal 114 lags the external clock signal 112 to increase the frequency of the feedback clock signal 114. Conversely, at time $t_5$ the external clock signal 112 lags the feedback clock signal 114 by the difference of $t_4$ and $t_5$. In response to a rising edge of the feedback clock signal 114 at time $t_4$, the phase detector 110 drives the DN_signal 122 high. At time $t_5$ and in response to a rising edge of the external clock signal 112, the phase detector 110 drives the DN_signal 122 low. Thus, the phase detector 110 generates the DN_signal 122 as a positive pulse on the DN_signal 122 having a width proportional to the time the feedback clock signal 114 leads the external clock signal 112 to decrease the frequency of the feedback clock signal 114.

The PLL 100 will continue to generate appropriate negative UP_signals 120 or positive DN_signals 122 until the feedback clock signal 114 is in phase and thus at the same frequency as the external clock signal 112 to keep the PLL 100 in lock. With further reference to FIG. 2, at time $t_n$ a rising edge of the external clock signal 112 is at nearly the same time as the rising edge of the feedback clock signal 114. Therefore, the PLL 100 locks.

The time it takes the PLL 100 to lock is typically an important parameter of the PLL. This is due, in part, to the fact that the PLL is not really usable for its intended purpose until the PLL 100 is locked. Traditionally, one technique that has been used to reduce the lock time has been to increase the loop gain. Once the loop gain exceeds a certain range, however, increasing the loop gain may increase the lock time, rather than reducing the lock time. In addition to increasing the lock time, very high loop gains often result in loop instability. If a PLL is unstable, the PLL will not lock and will not function properly. An example of instability in PLL occurs when the charge pump continuously overcompensates for the phase difference of the two input signals.

Therefore, there is a need for a PLL having a relatively short lock time while maintaining stability of the PLL.

DETAILED DESCRIPTION

Embodiments of the present invention are directed toward, for example, providing a system and method of reducing the lock time of a phase locked loop (PLL). Certain details are set forth below to provide a sufficient understanding of the embodiments of the invention. However, it will be clear to one skilled in the art that various embodiments of the invention may be practiced without these particular details.

Figure 1:
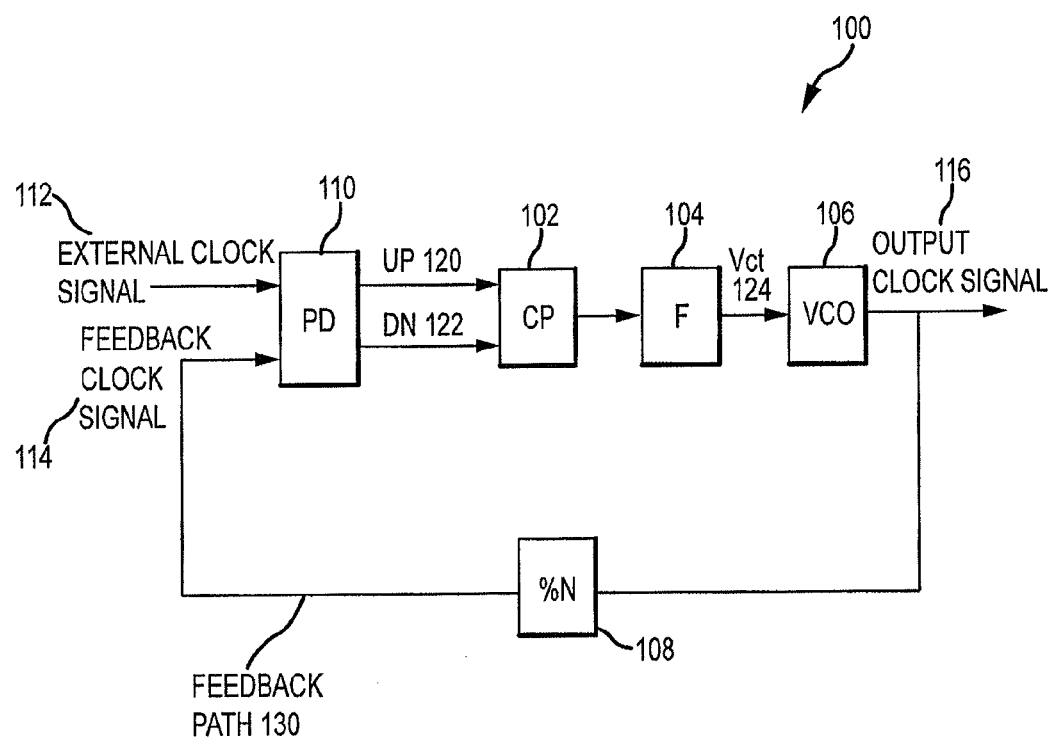
FIG. 1 is a block diagram of a phase locked loop in accordance with prior art.
Figure 2:
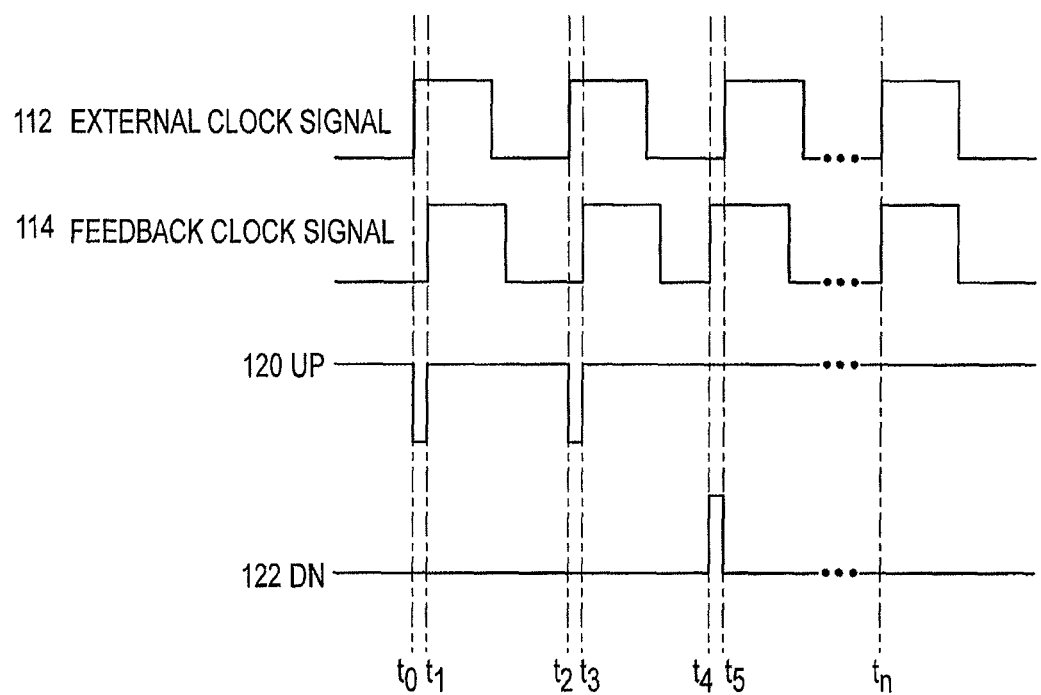
FIG. 2 is a timing diagram representative of waveforms at the input/output of the phase detector of a phase locked loop in accordance with prior art.
Figure 3:
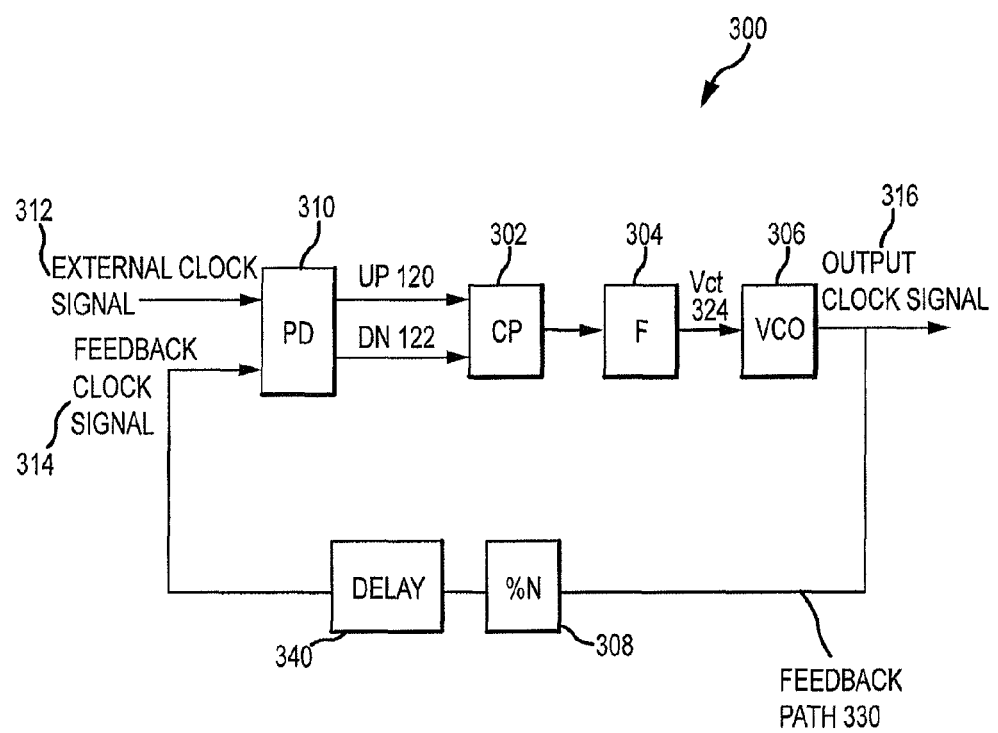
FIG. 3 is a block diagram of a phase locked loop according to one embodiment of the invention.

FIG. 3 is a functional block diagram of a PLL 300 according to one embodiment of the invention. Although the PLL 300 in FIG. 3 shows a charge pump PLL, any type of PLL may be used. The PLL 300 includes a phase detector 310, a charge pump 302, a filter 304, a voltage control oscillator 306, an N divider circuit 308 and a delay circuit 340 connected to each other as shown. Most of the components of the PLL 300 are used in the PLL 100 shown in FIG. 1, and they operate in the same manner. Therefore, in the interest of brevity, an explanation of their structure and function will not be repeated. The PLL 300 differs from the PLL 100 by placing a delay circuit 340 between the N divider circuit 308 and the phase detector 310 along the feedback path.

The delay circuit 340 has the effect of increasing the stability of the PLL 300 so that the gain can be increased to reduce lock time without making the PLL 300 unstable. The delay circuit 340 may be any type of delay circuit. In one embodiment, the amount of delay applied to the feedback clock signal 314 depends on the value of the loop gain. For example, as the loop gain increases, the amount of delay added to the feedback clock signal 314 also increases. The amount of delay may be defined relative to the external clock signal 312. For example, the delay circuit 340 may delay the period of the feedback clock signal 314 along the feedback path 330 between about 20% and about 70% of the external clock signal 312, such as between about 30% and about 60% of the external clock signal 312.

Figure 4:
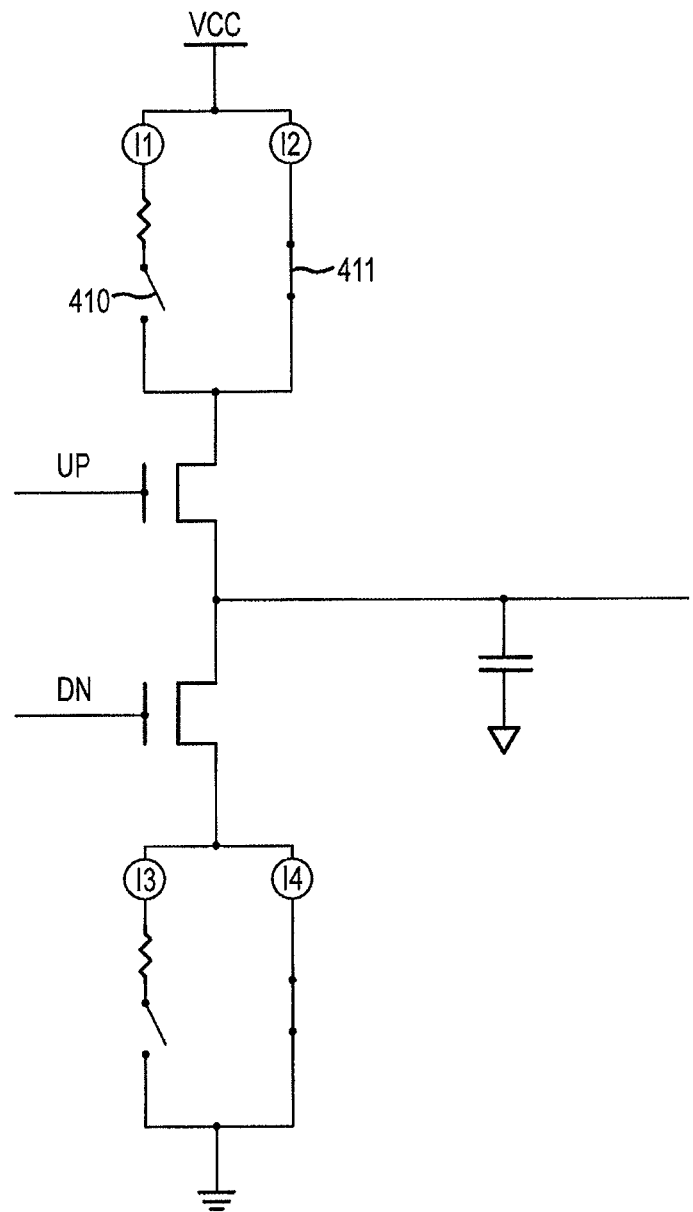
FIG. 4 shows a schematic illustration of one way to reduce the loop gain.

In other embodiments, the amount of delay applied to the feedback clock signal 314 may remain constant. For example, the delay may remain along the feedback path 330 even after the PLL 300 locks. If the amount of delay changes over time, the delay may change before or after the PLL 300 locks. Examples of the delay changing over time include the delay being added and/or removed from the feedback path 330. In addition, the delay amount may be increased and/or decreased. The change to the delay may be gradual or immediate. In one embodiment, the delay may be removed or reduced after the PLL 300 has locked to reduce jitter. Typically, when the PLL 300 is locked, the two phases are very closely aligned but not identical. Therefore, as the variation of the static phase offset goes to zero, the jitter is reduced. Thus, the delay may be removed or reduced after the PLL is locked to reduce the static phase offset. This is done with the reduction of charge pump current to help ensure loop stability. FIG. 4 shows a schematic drawing for reducing the charge pump current. In this embodiment, the delay may be reduced or eliminated while reducing the loop gain. Switch 410 reduces the amount of current out of the capacitor, which reduces the voltage step. By reducing the voltage step, the charge pump current is reduced, and thus the loop gain is reduced.

In one embodiment, the loop gain is increased as the amount of delay is increased. Increasing the loop gain increases the bandwidth of the loop. As will be understood by those skilled in the art, one way to increase loop gain is to increase the charge pump current. Other ways of increasing the loop gain are within the knowledge of those of ordinary skill in the art, and will not be described herein in the interest of brevity.

The delay circuit 340 may be located anywhere along the feedback path 330. FIG. 3 shows the delay circuit 340 after the N divider circuit 308, however, the delay circuit 340 may be located before the N divider circuit 308. Furthermore, if no N divider circuit 308 is provided in the feedback path 330 of the PLL 300, the delay circuit 340 may be located at any location along the feedback path 330. Similarly, if additional circuits are provided along the feedback path 330, the delay circuit 340 may be located in any position relative to the additional circuits.

Figure 5A:
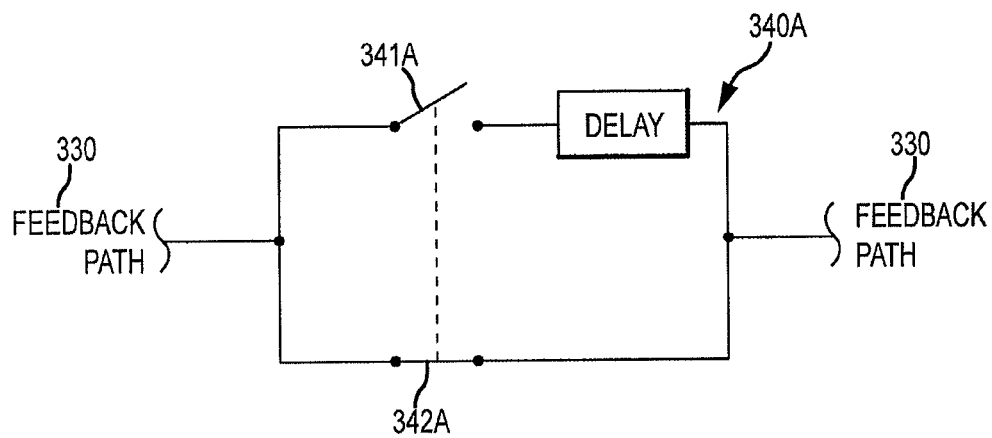
FIGS. 5A and 5B are schematic illustrations of a delay circuit according to one embodiment of the invention.
Figure 5B:
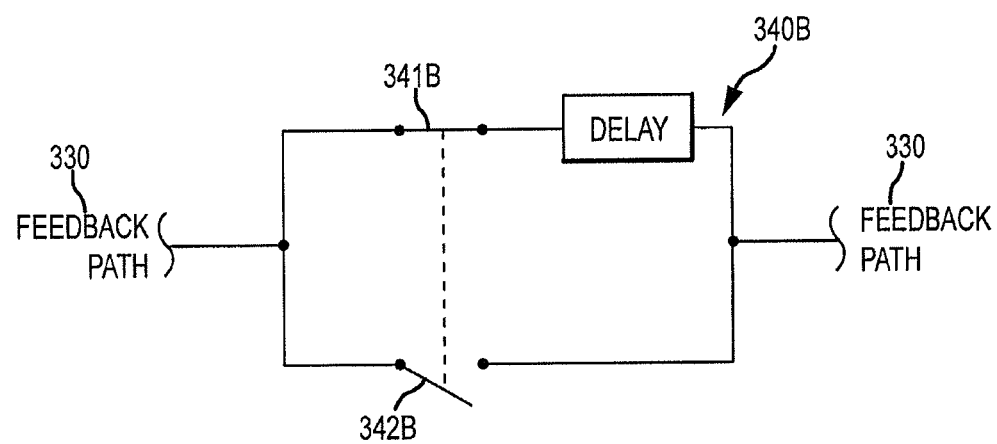

One embodiment of the delay circuit 340 that may be used in the PLL 300 of FIG. 3 is shown in the schematic illustrations of FIGS. 5A and 5B. In both Figures delay circuits 340A and 340B include a bypass path, such as alternately closed switches 341A, 342B, which may be a transistor, relay or other device, for turning off and on the delay. In FIG. 5A switch 341A is open and switch 342A is closed to bypass the delay circuit. FIG. 5B shows the delay circuit 340B with the switch 341B closed and the switch 342B open so that the delay is applied to the feedback clock signal 314 (in FIG. 3) along the feedback path 330.

Figure 6A:
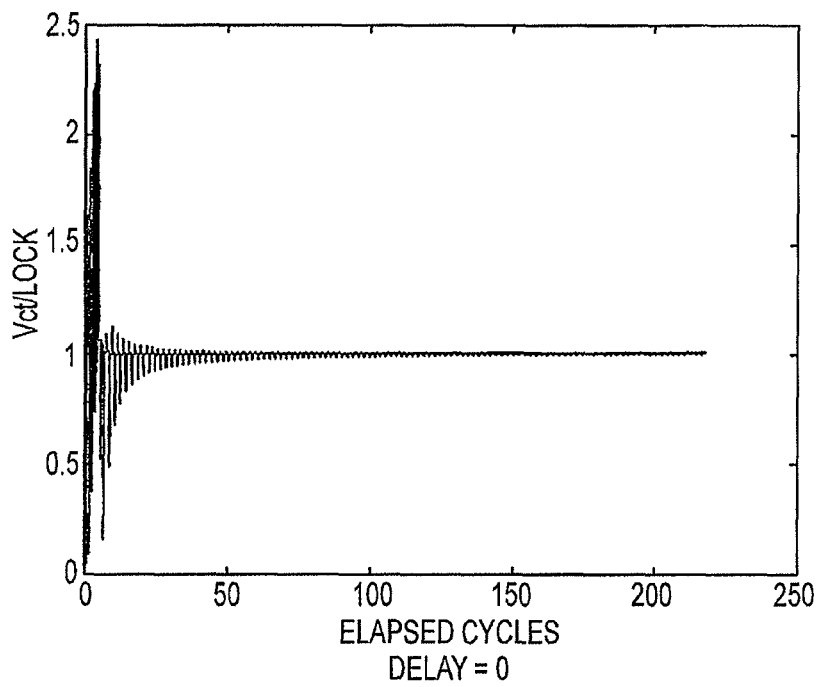
FIG. 6A is a simulation graph representative of the number of cycles for a PLL to lock in accordance with prior art.
Figure 6B:
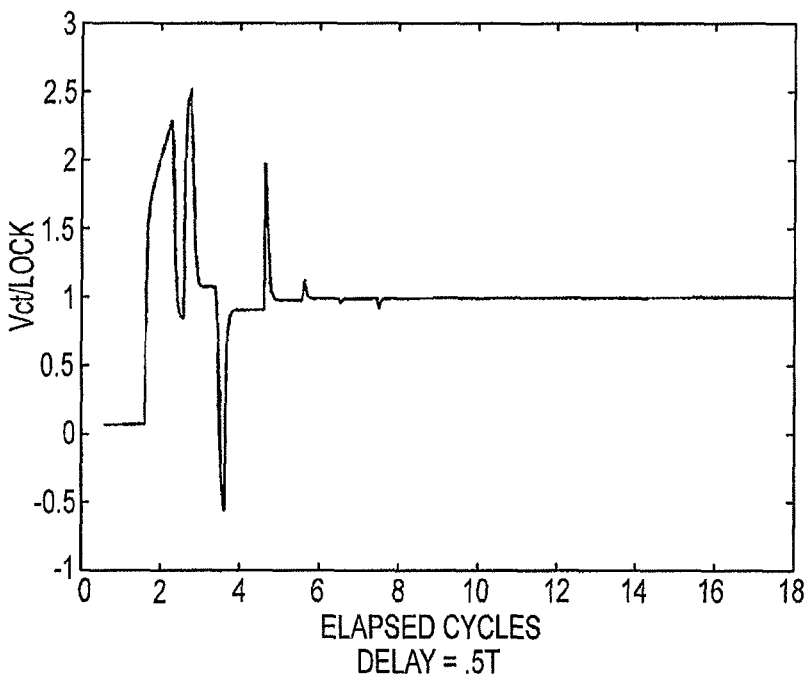
FIG. 6B is a simulation graph representative of the number of cycles for a PLL to lock in accordance with one embodiment of the invention.

The simulated lock behavior of a PLL similar to the PLL 300 in FIG. 3 is shown in FIGS. 6A and 6B. With reference to FIGS. 6A and 6B, simulations were conducted on the PLL 300 without a delay and with a delay, respectively. In both simulations the relevant input parameters were the same, such as cycle time of the external clock and pump current. In addition, both simulated PLLs had very high loop gain. FIG. 6A did not have a delay applied during the feedback path and FIG. 6B had a 0.5 period delay relative to the external clock applied to the feedback clock signal along the feedback path. A 0.5 delay is a 180° shift of the cycle time of the external clock. FIG. 6A shows that the PLL without the delay circuit 340 cycled about 220 times before locking. In contrast, the diagram in FIG. 6B shows that the PLL with the delay circuit 340 cycled less than 20 times before locking. Therefore, the addition of the delay circuit significantly reduced the lock time of the PLL.

Figure 7:
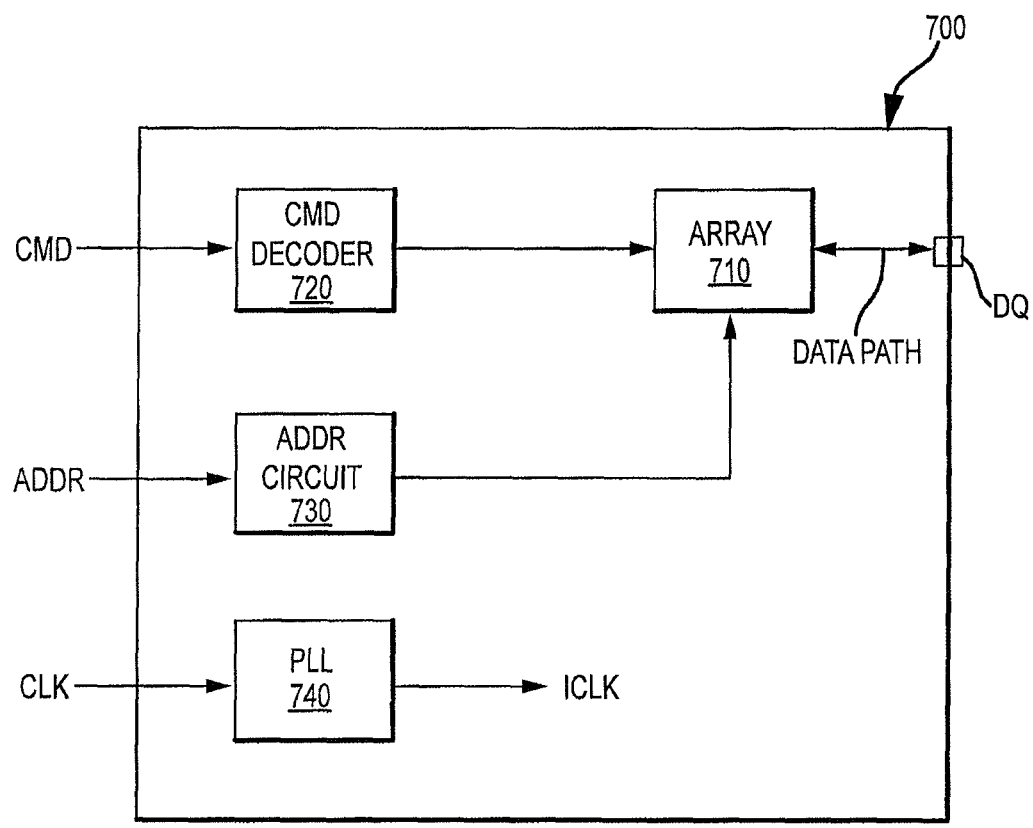
FIG. 7 is a block diagram of a memory device using a PLL according to one embodiment of the invention.

FIG. 7 shows a memory device 700 according to one embodiment of the invention. The memory device 700 is a dynamic random access ("DRAM"), although the principles described herein are applicable to DRAM cells, Flash or some other memory device that receives memory commands. The memory device 700 includes a command decoder 720 that generates sets of control signals corresponding to respective commands to perform operations in memory device 700, such as writing data to or reading data from memory device. The memory device 700 further includes an address circuit 730 that selects the corresponding row and column in the array. Both the command signals and address signals are typically provided by an external circuit such as a memory controller (not shown). The memory device 700 further includes an array 710 of memory cells arranged in rows and columns. The array 710 may be accessed on a row-by-row, page-by-page or bank-by-bank basis as will be appreciated by one skilled in the art. The command decoder 720 provides the decoded commands to the array 710, and the address circuit 730 provides the row and column address to the array 710. Data is provided to and from the memory device 700 via a data path.

The data path is a bidirectional data bus. During a write operation write data are transferred from a data bus terminal DQ to the array 710 and during a read operation read data are transferred from the array 710 to the data bus terminal DQ. A PLL 740, such as the PLL 300 from FIG. 3, may be located in the memory device. The PLL 740 receives a CLK signal as a reference signal and generates one or more internal clock signals ("ICLK") that may be used to perform a variety of operations in the memory device. For example, the ICLK may be used to capture command, address and write data signals, transmit read data signals from the memory device, or perform a variety of other functions.

Figure 8:
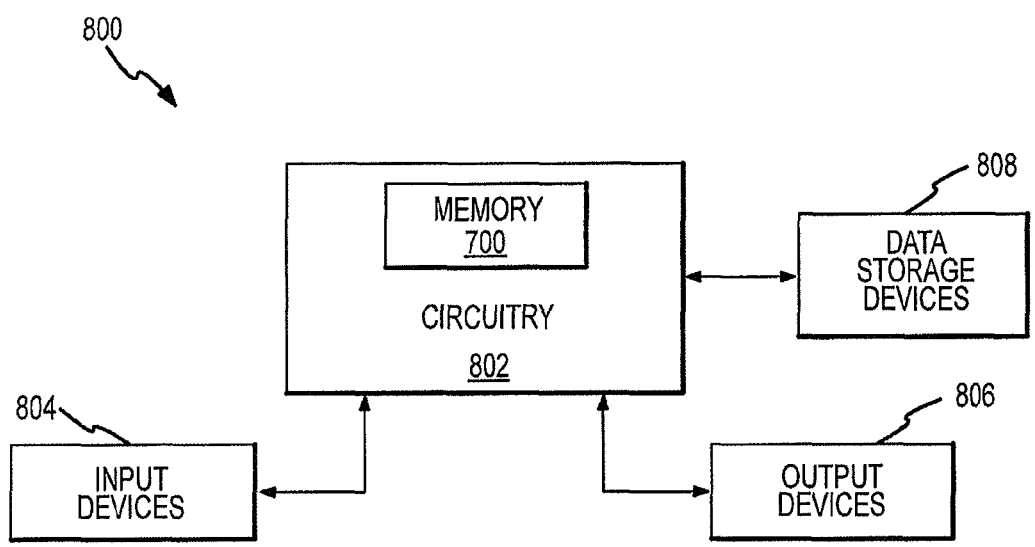
FIG. 8 is a block diagram of an embodiment of a processor based system using the memory device of FIG. 7.

FIG. 8 is a block diagram of an embodiment of a processor-based system 800 including processor circuitry 802, which includes the memory device 700 of FIG. 7 or a memory device according to some other embodiment of the invention. Conventionally, the processor circuitry 802 is coupled through address, data, and control buses to the memory device 700 to provide for writing data to and reading data from the memory device 700. The processor circuitry 802 includes circuitry for performing various processing functions, such as executing specific software to perform specific calculations or tasks. In addition, the processor-based system 800 includes one or more input devices 804, such as a keyboard or a mouse, coupled to the processor circuitry 802 to allow an operator to interface with the processor-based system 800. Typically, the processor-based system 800 also includes one or more output devices 806 coupled to the processor circuitry 802, such as output devices typically including a printer and a video terminal. One or more data storage devices 808 are also typically coupled to the processor circuitry 802 to store data or retrieve data from external storage media (not shown). Examples of typical data storage devices 808 include hard and floppy disks, tape cassettes, compact disk read-only ("CD-ROMs") and compact disk read-write ("CD-RW") memories, and digital video disks ("DVDs").

Although the present invention has been described with reference to the disclosed embodiments, persons skilled in the art will recognize that changes may be made in form and detail without departing from the spirit and scope of the invention. Such modifications are well within the skill of those ordinarily skilled in the art. Accordingly, the invention is not limited except as by the appended claims.

I claim:

1. A locked loop, comprising:
a phase comparison circuit configured to receive an external signal and a feedback signal, the phase comparison circuit further configured to generate a phase difference signal;
a signal generator configured to receive the phase difference signal and generate an output signal, the output signal having a frequency based, at least in part, on the phase difference signal; and
a delay circuit configured to receive the output signal and generate the feedback signal, the delay circuit configured in a first mode, before the locked loop is locked, to add a delay to the output signal to, at least in part, generate the feedback signal, and being configured in a second mode, after the locked loop is locked, to generate the feedback signal from the output signal without any substantial added delay.

2. The locked loop of claim 1, wherein the phase difference signal is filtered before being received at the signal generator.

3. The locked loop of claim 1, wherein the delay, in the first mode of the delay circuit, is adjustable as a function of a period of the external signal.

4. The locked loop of claim 1, wherein the delay, in the first mode of the delay circuit, is adjustable as a function of a loop gain of the locked loop.

5. The locked loop of claim 4, wherein the delay is decreased as the loop gain is decreased.

6. The locked loop of claim 4, wherein the delay is increased as the loop gain is increased.

7. The locked loop of claim 1, wherein the phase comparison circuit comprises:
a phase detector; and
a charge pump.

8. The locked loop of claim 7, wherein the delay, in the first mode of the delay circuit, is decreased as a current through the charge pump decreases.

9. A locked loop, comprising:
a phase comparison circuit configured to receive an external signal and a feedback signal, the phase comparison circuit further operable to generate a phase difference signal;
a signal generator configured to receive the phase difference signal and generate an output signal, the output signal having a frequency based, at least in part, on the phase difference signal; and
a delay circuit comprising:
a switch; and
a delay element, wherein the switch is configured, in a first mode, before the locked loop is locked, to couple the delay element between the signal generator and the phase comparison circuit to generate the feedback signal, and in a second mode, after the locked loop is locked, to remove the delay element to generate the feedback signal without any substantial added delay.

10. The locked loop of claim 9, wherein the delay element in the delay circuit delays the output signal to generate the feedback signal, and the delay is based, at least in part, on a loop gain of the locked loop.

11. The locked loop of claim 9, wherein the delay element in the delay circuit delays the output signal to generate the feedback signal, and the delay is based, at least in part, on a period of the external signal.

12. The locked loop of claim 11, wherein the delay is between about 20% and 70% of the period of the external signal.

13. The locked look of claim 12, wherein the delay is between about 30% and 60% of the period of the external signal.

14. A method for reducing lock time in a locked loop, comprising:
generating a control signal as a function of the difference between an external signal and a feedback signal;
generating an internal signal as a function of the control signal; and
generating the feedback signal by selectively adding a delay to the internal signal;
wherein the delay is removed to generate the feedback signal without any substantial added delay when the loop is locked.

15. The method of claim 14, wherein the delay is changed immediately.

16. The method of claim 15, wherein the delay is changed immediately by bypassing the delay when the loop is locked.

17. The method of claim 16 wherein bypassing the delay when the loop is locked comprises selectively removing the delay by a switch.

18. A method for reducing lock time in a locked loop, comprising:
receiving a reference signal;

comparing the reference signal with a feedback signal to generate a difference between the reference signal and the feedback signal;

filtering the difference;

generating, in a controlled oscillator, an internal signal based at least in part on the difference; and generating, in a delay circuit, the feedback signal;

wherein the delay circuit, in a first mode, after the locked loop is locked, generates the feedback signal without delaying the internal signal, and, in a second mode, before the locked loop is locked, generates the feedback signal by adding a delay to the internal signal.

19. The method of claim 18, wherein the delay is added as a function of a gain value of the locked loop.

20. The method of claim 18, wherein the delay is added as a function of a period of the external signal.

21. The method of claim 18, further comprising:

gradually decreasing a gain of the locked loop at substantially the same time as decreasing the delay.

* * * * *

UNITED STATES PATENT AND TRADEMARK OFFICE
CERTIFICATE OF CORRECTION

| | | |
|---|---|---|
| PATENT NO. | : 8,624,685 B2 | Page 1 of 1 |
| APPLICATION NO. | : 13/150860 | |
| DATED | : January 7, 2014 | |
| INVENTOR(S) | : Shizhong Mei | |

It is certified that error appears in the above-identified patent and that said Letters Patent is hereby corrected as shown below:

In the Specification:

In column 1, line 9, delete "That" and insert -- This --, therefor.

In the Claims:

In column 6, line 44, in Claim 13, delete "look" and insert -- loop --, therefor.

Signed and Sealed this
Fifteenth Day of April, 2014

Michelle K. Lee
*Deputy Director of the United States Patent and Trademark Office*